(12) United States Patent
Deml (10) Patent No.: US 7,893,751 B2
(45) Date of Patent: Feb. 22, 2011

(54) METHOD AND CIRCUIT FOR PROTECTING A MOSFET

(75) Inventor: Christoph Deml, Munich (DE)

(73) Assignee: Infineon Technologies Austria AG, Villach (AT)

(*) Notice: Subject to any disclaimer, the term of this patent is extended or adjusted under 35 U.S.C. 154(b) by 15 days.

(21) Appl. No.: 12/363,250

(22) Filed: Jan. 30, 2009

(65) Prior Publication Data

US 2010/0194464 A1 Aug. 5, 2010

(51) Int. Cl.
*H03K 17/687* (2006.01)
(52) U.S. Cl. ...................... 327/434; 327/170
(58) Field of Classification Search ........... 327/434, 327/170
See application file for complete search history.

(56) References Cited

U.S. PATENT DOCUMENTS

| | | | | |
|---|---|---|---|---|
| 5,747,943 A * | 5/1998 | Houk et al. | ................. | 315/225 |
| 5,932,974 A * | 8/1999 | Wood | .......................... | 315/119 |
| 6,002,213 A * | 12/1999 | Wood | .......................... | 315/307 |
| 6,127,746 A * | 10/2000 | Clemente | .................... | 307/131 |
| 6,133,766 A * | 10/2000 | Pulvirenti et al. | ........... | 327/103 |
| 6,185,082 B1 * | 2/2001 | Yang | ............................ | 361/90 |
| 6,734,652 B1 * | 5/2004 | Smith | ......................... | 320/163 |
| 6,784,708 B1 * | 8/2004 | Krenzke | ..................... | 327/170 |
| 6,809,568 B2 * | 10/2004 | Kamel et al. | ................ | 327/170 |
| 6,861,898 B2 * | 3/2005 | Hsu et al. | .................... | 327/552 |
| 7,304,828 B1 * | 12/2007 | Shvartsman | ............... | 361/93.1 |
| 7,330,065 B2 * | 2/2008 | Simonson | .................... | 327/427 |
| 7,633,778 B2 * | 12/2009 | Mok et al. | .................... | 363/60 |
| 7,675,346 B2 * | 3/2010 | Kesler | ........................ | 327/376 |
| 2003/0174004 A1 * | 9/2003 | Kamel et al. | ................ | 327/170 |
| 2004/0061551 A1 * | 4/2004 | Hsu et al. | .................... | 327/552 |
| 2004/0109270 A1 * | 6/2004 | Stockinger et al. | ............ | 361/56 |
| 2005/0122176 A1 * | 6/2005 | Hsu et al. | ..................... | 331/16 |
| 2006/0215428 A1 * | 9/2006 | Mok et al. | .................... | 363/59 |
| 2008/0211847 A1 * | 9/2008 | Shamoun | ...................... | 347/10 |
| 2009/0111417 A1 * | 4/2009 | Waagaard et al. | .......... | 455/296 |
| 2009/0230906 A1 * | 9/2009 | Sardat | .................... | 318/400.26 |
| 2009/0302927 A1 * | 12/2009 | Doffin | ........................ | 327/434 |

* cited by examiner

*Primary Examiner*—Lincoln Donovan
*Assistant Examiner*—Adam D Houston
(74) *Attorney, Agent, or Firm*—Slater & Matsil, L.L.P.

(57) ABSTRACT

An integrated circuit includes a transistor. During operation a current slew-rate is determined based on a duration the transistor has been conducting and a current flowing through the transistor. The transistor can then be controlled to switch to its non-conducting state using the slew-rate.

23 Claims, 5 Drawing Sheets

METHOD AND CIRCUIT FOR PROTECTING A MOSFET

TECHNICAL FIELD

The invention relates to the field of electrical circuits comprising transistors. In one embodiment, the invention describes a method and corresponding circuits for protecting power MOSFETs employed as switches from overload when switching a coupled load circuit off while at the same time limiting the radiation resulting from the switching current.

BACKGROUND

Transistors can be employed as switches in electrical circuits, in particular, power MOSFETs can be employed as switches in a load circuit for coupling a load to a source. The transistor may be either switched on, i.e., to its conducting state, thus allowing a current flow through the load circuit, or the transistor may be switched off, i.e., switched to non-conducting.

When switching the transistor on, i.e., switching the transistor to conducting, the electrical load is coupled to the voltage or current source allowing a current to flow through the circuit, i.e., through the transistor and the load. When switching a transistor off, i.e., switching the transistor from conducting to non-conducting, the transistor will disconnect the load circuit from the source, such that the transistor will stop a current flow in the load circuit. However, if the load circuit comprises an inductor or a capacitor, the current flow in the load circuit will not stop immediately when switching the transistor off. If the circuit comprises an inductor, then this will discharge its stored energy, such that the current flowing in the load circuit and through the transistor decreases with time until the inductor is fully discharged.

The discharge current flowing through the MOSFET in combination with the voltage drop across the MOSFET during the switch-off process, i.e., while the complex load discharges, heats the MOSFET. In particular, the pn-junction within the MOSFET is heated by the energy absorbed in the MOSFET. This heating may destroy the MOSFET as the semiconductor material may become intrinsically conductive when heated above a threshold temperature, such that the MOSFET may not be controllable any more. Accordingly the energy absorbed by the MOSFET should be limited such that the MOSFET can handle the switch-off process without being damaged.

A strong discharge current furthermore affects a changing magnetic field, which may couple to lines and induce undesired interferences. These interferences intensify with faster changing current amplitudes. That is, when switching the load circuit off, then the current dropping may affect undesired interferences, which intensify with the current decreasing faster. Accordingly the slew rate of the current when switching the load circuit off should be limited in order to lessen the produced magnetic field and thus to lessen interferences in adjacent lines.

Hence a transistor operated as a power switch should be protected from situations that heat its structure above an allowed temperature while at the same the slew rate of the discharge current should be limited in order to prevent undesired interferences in adjacent lines or electronic components. Particularly when switching a transistor off in an overload situation, i.e., in case the current through the transistor exceeds a predefined threshold value causing the transistor to be switched off, the main goal of controlling the switch-off process is to protect the transistor from being superheated.

However in deliberate switch-off situations, i.e., when the current through the transistor is below the predefined threshold indicating an overload situation, the process of switching the transistor to its off state can be optimized such that electromagnetic emissions are limited by controlling the slew rate while at the same time preserving the transistor from absorbing too much energy.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The present invention will now be described with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In particular, functional blocks may be implemented arbitrarily as long as the block provides the required function.

Although the embodiments described herein, in particular, relate to an N-MOSFET employed as a switch the disclosed method and circuitry generally may be applied to circuits comprising any transistor operated as a power switch, particularly to P- or N-MOSFETs.

Figure 1A:
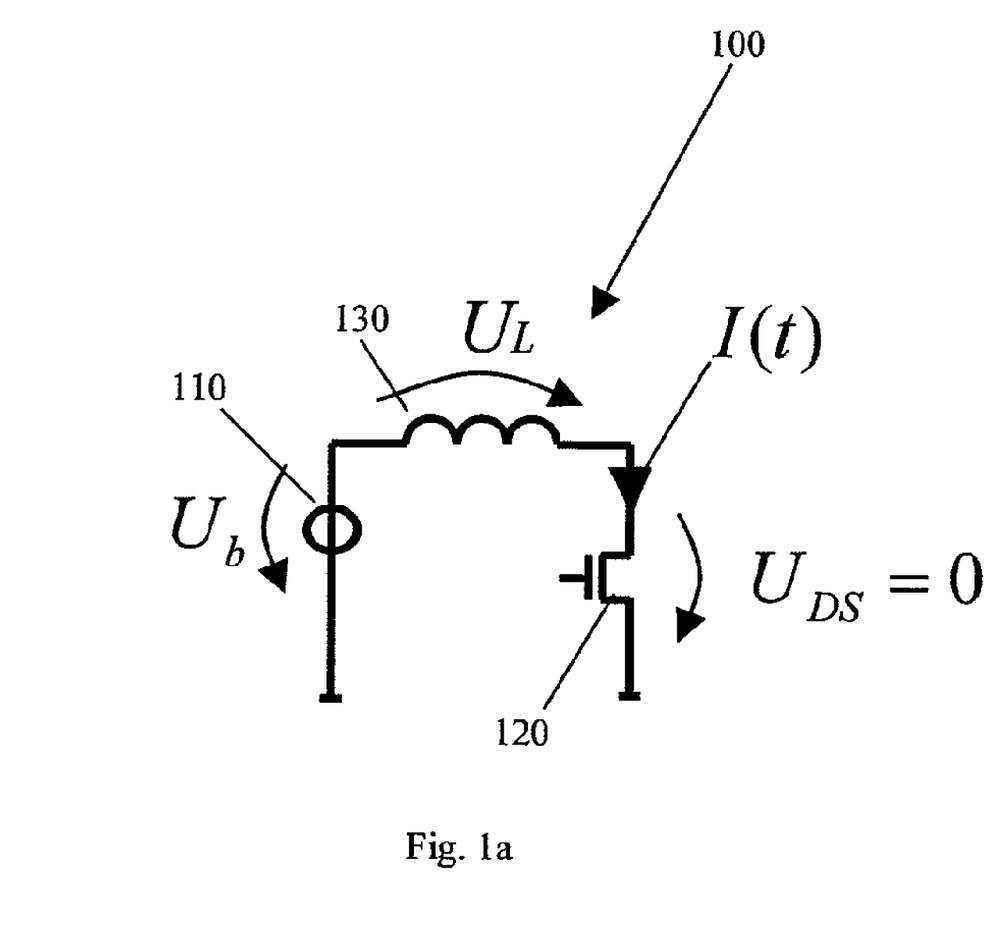
FIG. 1a depicts a circuit diagram comprising a transistor as a switch and an inductive load in operation.

FIG. 1 depicts a circuit 100 comprising a voltage source 110, a MOSFET 120 and a complex load 130, which in the following is assumed as an inductor. Voltage source 110 can be any electrical source suitable for supplying the load circuit with electrical energy. Generally the described invention can be used with all kinds of passive loads in the load circuit. Accordingly the load circuit may also comprise capacitors or ohmic resistors. However as inductors are the most critical components when considering a switch off process, the following description assumes that inductor 130 is the only load in the load circuit.

In operation, power MOSFET 120 is controlled to switch to conducting, i.e., in case of an N-MOSFET a high voltage is applied to its gate for switching to conducting. As the switch is assumed to be ideal the voltage drop across MOSFET 120 is assumed to be zero, i.e., $U_{DS}=0$. Accordingly the voltage of source 110 solely drops across complex load 130, i.e., voltage $U_{DS}$ across inductor 130 equals source voltage $U_b$.

The energy $E_L$ stored in the inductor is given by $E_L = \frac{1}{2} \cdot L I^2$ with L being the inductivity value of inductor 130 and I being the current through inductor 130, wherein we assume a constant slew rate during the switch off process.

When switching MOSFET 120 from conducting to non-conducting inductor 130 "tries" to keep up the current flow through itself, thus causing a current flowing through the circuit and thus through MOSFET 120.

When switching the MOSFET from its conducting state to its non-conducting state the current amplitude does not drop to zero instantly. Instead the current will decrease with a slew-rate as the conductivity of the transistor channel does not change to zero instantly. Consequently the process of switching the MOSFET to its non-conducting state spans a time interval, during which the current amplitude decreases from its initial amplitude value $I(t=0)=I_0$ to zero. As the conductivity of MOSFET 120 is switched from a negligible resistance, i.e., from the channel conductivity in conducting state, to an infinite resistance in order to cut off the current through the load circuit, there is a considerable voltage drop across MOSFET 120 during the switch-off process. Consequently we find $U_{DS}>0$ during the process of switching the MOSFET off.

During the process of switching the MOSFET to its non-conducting state, the energy stored in inductance 130 discharges into MOSFET 120, wherein the voltage in the circuit is nearly constant over time when the inductance discharges. Also voltage source 110 supplies some energy during the switching-off process. MOSFET 120 thus absorbs the energy stored in inductance 130 and from the source. The absorbed energy is dissipated into thermal energy within the MOSFET. The process of discharging inductor 130 in this way heats MOSFET 120, wherein the MOSFET is destroyed when the pn-junction within the MOSFET exceeds a temperature limit. Heating of the pn-junction in the MOSFET to a temperature exceeding the limit destroys the transistor as the semi-conducting material then may become intrinsically conductive, such that the MOSFET cannot be switched off anymore and thus becomes uncontrollable.

Accordingly the MOSFET must be switched off such that the energy absorbed in the MOSFET does not heat the pn-junction beyond its temperature limit.

In order to optimize the slew rate of the current in the switch-off process we assume that the current actually flowing through transistor 120 is known. This can be achieved, for example, by integrating conventional means in circuit 100 for measuring a current $I(t)$ in circuit 100. The current in the circuit is that through MOSFET 120. Furthermore we assume that a time measurement unit is present in the circuit for measuring the on-time $t_e$ (enable time) of the MOSFET, i.e., the duration the MOSFET is switched on, thus providing a signal indicating the duration the MOSFET has been conducting and allowing the current to raise during $t_e$.

In order to estimate safe conditions for switching the MOSFET off we assume a worst-case scenario, because in real life the actual topology of the load circuit in many cases is unknown. As large inductances are the most critical elements in a load circuit when switching the MOSFET off, we assume the MOSFET to be coupled to an inductance only without any ohmic resistances in the load circuit.

Accordingly at the time of switching the MOSFET off the size of the inductance can be determined from the current flowing through the MOSFET and the time passed since switching the MOSFET to conducting, since the inductance is the only element in the load circuit, besides the negligible MOSFET resistance, that limits the current. While the MOSFET has been conducting the entire voltage of voltage source 110 dropped across inductance 130 causing a steady and linear increase of current $I(t)$. Consequently the inductivity value L of inductance 130 can be determined from the current through the inductance at the time when switching the MOSFET off and the time since switching the MOSFET to conducting. That is from:

$$U_L(t) = L\frac{dI}{dt} \tag{1}$$

we find, $$L_{w.c.} = U_b \cdot t_e / I_0 \tag{2}$$

wherein, $L_{w.c.}$ is the inductance value we assume in our worst-case (w. c.) scenario, $U_b$ is the voltage of voltage source 110, $t_e$ is the time the MOSFET is enabled, i.e., the time span since switching the MOSFET to conducting, $I_0$ is the current through the MOSFET when switching the MOSFET off.

When switching transistor 120 from its conducting to its non-conducting state the energy stored in inductance 130 will discharge into MOSFET 120. Also, as long as the transistor is not fully switched to its non-conducting state, voltage source 110 will feed further energy into the transistor. Accordingly the energy absorbed in the transistor when switching the transistor off can be determined to:

$$E = \int_{t=0}^{t=\tau} U_{DS}(t) \cdot I(t) dt = \int_{t=0}^{t=\tau} \left(U_b - \frac{dI}{dt}L\right) \cdot I \cdot dt, \tag{3}$$

wherein, $U_{DS}(t)$ is the voltage across the MOSFET, i.e., the drain-source voltage, and $I(t)$ is the current in the circuit, and $t=0$ is the point in time the switch-off process starts, and $t=\tau$ is the point in time the switch-off process ends.

Considering now that during the switch-off process current $I(t)$ will start at a maximum current value $I(t=0)=I_0$ and then decrease linearly with a constant slew-rate to zero at time $t=\tau$, then the amount of energy absorbed in transistor 120 and according to equation (3) can be determined to:

$$E = \left(\frac{U_b}{-dI/dt} + L\right) \cdot \frac{I_0^2}{2}. \tag{4}$$

Considering further that the maximum inductance value of inductance 130, i.e., the worst case inductance value, can be estimated according to equation (2), and the current decreases linearly from its maximum to zero, such that:

$$\frac{dI}{dt} = \frac{I_0}{\tau}, \tag{5}$$

then the maximum energy absorbed in the transistor during the switch-off process can be determined to:

$$E_{w.c.} = \left(\frac{U_b \cdot \tau}{I_0} + \frac{U_b \cdot t_e}{I_0}\right)\frac{I_0^2}{2} = \frac{\tau + t_e}{2} \cdot U_b I_0. \qquad (6)$$

This energy heats the transistor, particularly the pn-junction within the transistor. Starting from a simplified, one-dimensional model for heat dissipation in the MOSFET device, wherein thermal energy is coupled to one end of a semiconductor rod of infinite length, the maximum temperature increase $\Delta T_{max}$ at the one end can be determined to be:

$$\Delta T_{max} = \frac{2 \cdot a \cdot E}{A} \cdot \frac{1}{\sqrt{\tau}}, \text{ wherein,} \qquad (7)$$

E is the absorbed energy, and

A is the cross-sectional area of the pn-junction in the MOSFET, and a is the dynamic heating coefficient of silicon, wherein a can be further determined to:

$$a = \frac{2}{\sqrt{\pi c \rho \lambda_{th}}} \cdot \frac{\sqrt{2}}{3}, \text{ wherein,} \qquad (8)$$

c is the specific heat capacity of silicon,

ρ is the density of silicon, and $\lambda_{th}$ is the specific heat conduction coefficient of silicon.

By replacing energy E in equation (8) with the energy as determined in equation (6), i.e., the energy the transistor has to absorb in the worst case scenario, we find the temperature increase $\Delta T_{max,w.c.}$ caused by switching the transistor off in our worst case scenario as:

$$\Delta T_{max,w.c.} = \frac{2 \cdot a}{A} \cdot \frac{\tau + t_e}{2} \cdot U_b I_0 \cdot \frac{1}{\sqrt{\tau}}. \qquad (9)$$

Figure 2:
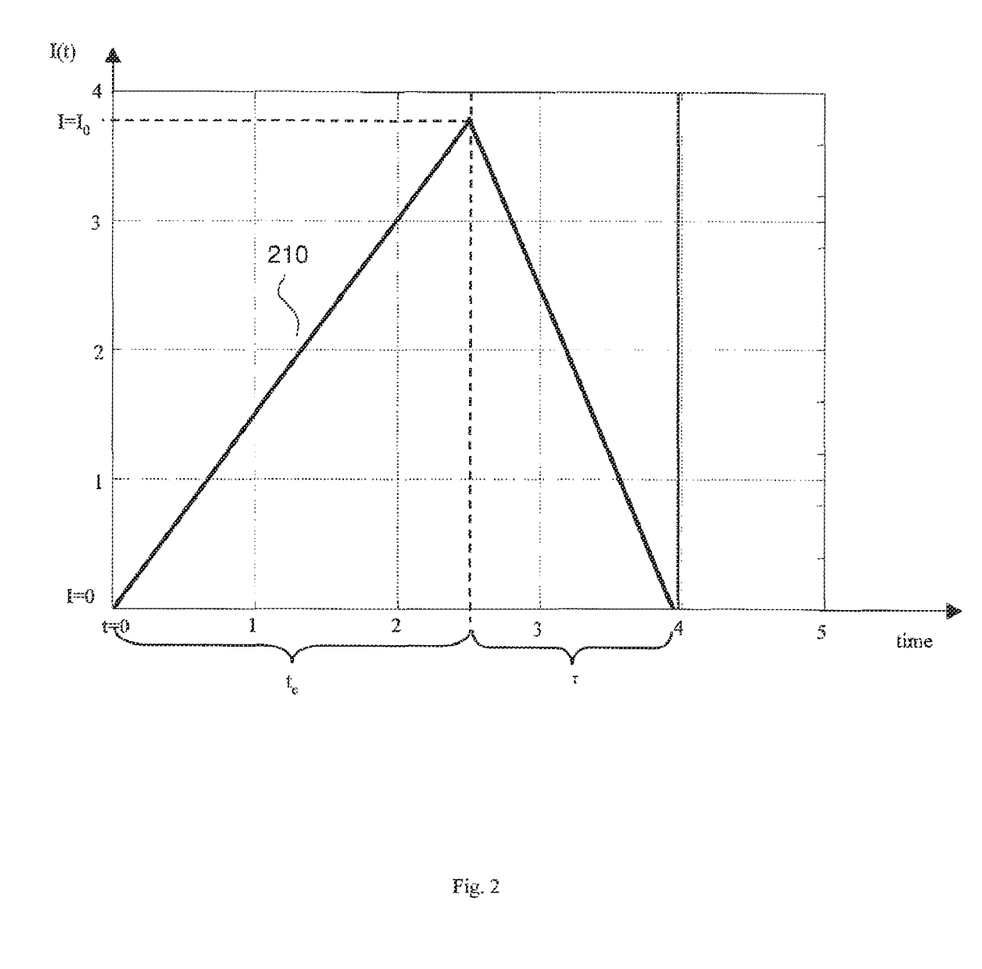
FIG. 2 schematically depicts the temporal development of a current through an inductance when coupling and decoupling the inductance to a power supply.

FIG. 2 schematically illustrates the process of switching the circuit on and off, wherein curve 210 is current I(t) through inductance 130.

While MOSFET 120 is switched on during time interval $t_e$ current I(t) linearly increases due to the assumed infinite value of inductance 130. Inductance 130 accordingly increases its stored energy during interval $t_e$. Then, when switching transistor 120 off, current I(t) linearly decreases from its maximum value $I_0$ until it reaches a zero amplitude value after time interval τ.

Referring again to equation (9) it is apparent that the maximum temperature depends on the duration τ of the switch off process. Taking now into account that the temperature of the transistor must not exceed the limit where the transistor is destroyed by overheating, we can define a maximum allowable temperature that may be caused by a switch off process, such that the duration of the switch off process is defined by the predefined maximum allowable temperature increase $\Delta T_{max,w.c.}$.

Equation (9) can be transformed accordingly, such that the duration for switching the transistor off is given as:

$$\tau = \left(\frac{\frac{\Delta T_{max,w.c.} \cdot A}{a \cdot U_b I_0} \pm \sqrt{\left(\frac{\Delta T_{max,w.c.} \cdot A}{a \cdot U_b I_0}\right)^2 - 4t_e}}{2}\right)^2. \qquad (10)$$

Quadratic equation (10) provides two solutions for τ. The solution involving the "+" provides the τ of higher value, i.e., a longer time span for switching the transistor from its conducting to its non-conducting state, such that there is a longer time span for controlling the decrease of current I(t) from its value $I_0$=I(t=0) to zero. Consequently the solution providing the τ of higher value affects a slower decrease, i.e., a smaller slew rate of the current, thus causing less interference. Hence the solution for τ involving the "−" is discarded in the following.

In this way an optimized switch-off time span τ for switching transistor 130 off can be determined, wherein the transistor may be heated by a predefined temperature $\Delta T_{max,w.c.}$, the time span τ further depending on the parameters of current $I_0$, voltage $U_b$ and time span $t_e$, which can be determined in the circuit using conventional elements. After the switch-off time span is determined, the transistor is controlled to switch to its non-conducting state within the switch-off time span τ as described below.

For determining the parameters as necessary for calculating the switch-off time conventional measuring devices and methods may be applied. For example, conventional current measuring means may be comprised in the circuit for measuring the amplitude of current I(t), such that the actual current value $I_0$ can be determined at the time when starting to switch off the transistor. Similarly the circuit may comprise a time measuring means for providing a signal reflecting time span $t_e$, i.e., indicating the duration the transistor has been in a conducting state. Lastly voltage $U_b$ can be determined using conventional measuring means or the voltage of the voltage source can be set as a constant as it is known in most cases.

Note that the predefined temperature increase of $\Delta T_{max,w.c.}$ will not be reached in real life circuit topologies. Any load circuit comprises ohmic resistors, which absorb energy when switching the transistor off and which have not been taken into account in the worst-case scenario. Furthermore the inductance comprised in the load circuit has a finite value, thus limiting the amount of energy stored therein.

Figure 3:
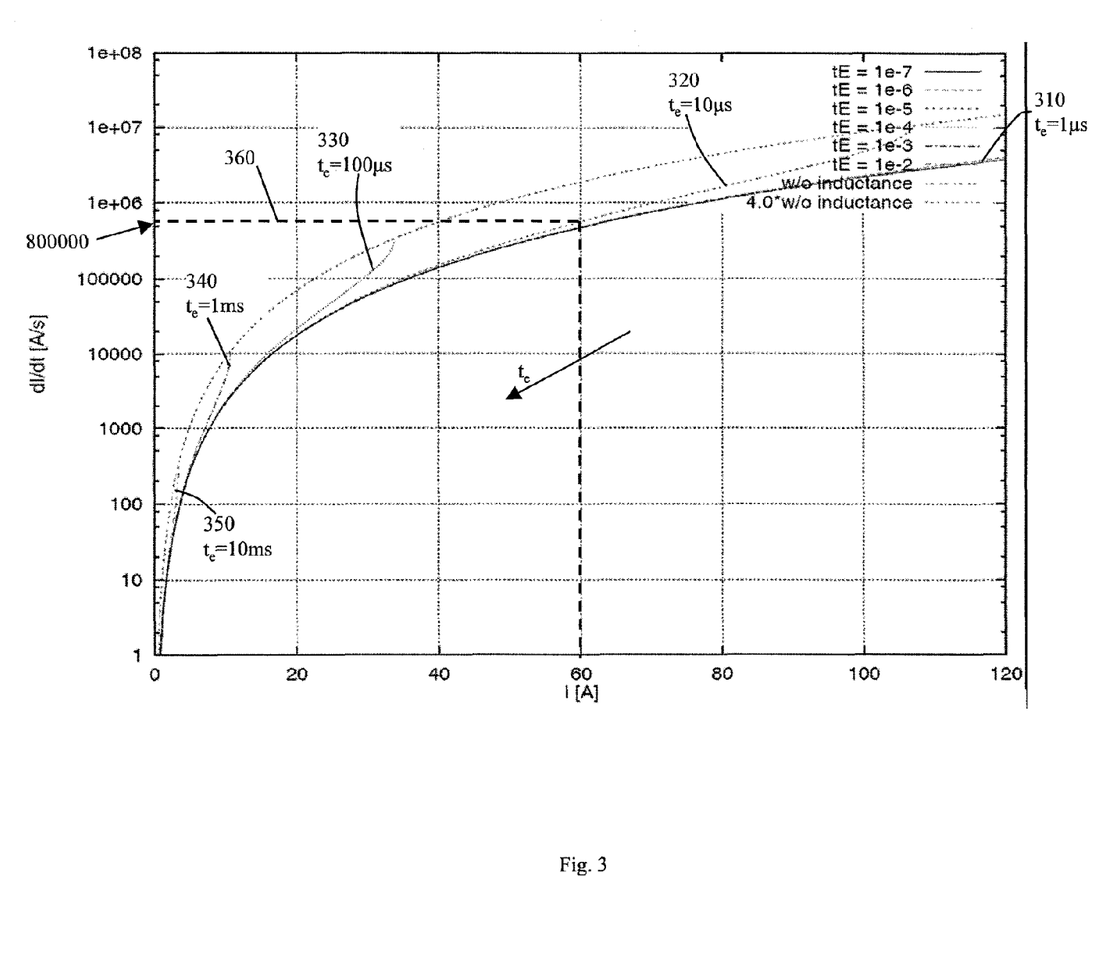
FIG. 3 depicts relations between current slew-rates for switching a transistor off and the current through the transistor when enabled for a given duration.

FIG. 3 graphically illustrates equation (10), wherein the current slew-rate is considered constant in time, such that $dI/dt=I_0/\tau$. The abscissa reflects current value $I_0$, whereas the ordinate specifies the slew-rate of the current when switching a transistor off. For example curve 310 specifies the slew-rate of the current when switching a transistor off after being switched on for $t_e$=1 μs, curve 320 specifies the slew-rate after the transistor has been switched on for $t_e$=10 μs, curve 330 illustrates the slew-rate for $t_e$=100 μs, curve 340 for $t_e$=1 ms, and curve 350 illustrates the slew-rate according to equation (10) for a switch-on time $t_e$=10 ms.

The shape of curves 310 to 350 at first shows a decreasing slope, which turns with increasing current to an increasing slope, wherein the end point may indicate to switch the transistor off. However switching a transistor off may be subject to further researches in order to protect the transistor from an overheat situation.

In order to determine a current slew rate for deliberately switching a transistor from conducting to its non-conducting state, i.e., for switching a transistor off, the slew rate can be determined using equation (10) and as illustrated by curves 310-350. For example, if a current value $I_0$=60 A is detected at the beginning of the switch-off process and after the transistor has been switched-on, e.g., $t_e$=10 μs, i.e., transistor 120 has been in its conducting state for 10 μs, then we can find a slew rate of about $$\frac{dI}{dt} \approx 800,000 \; A/s,$$

as indicated by dashed line 360. Similarly a slew-rate for the current can be found in for $t_e$=1 μs, confer curve 310. As curve 310 is situated below curve 320, the resulting slew-rate is smaller. That is with increasing time the transistor has been conducting smaller slew-rate results for a given current. This follows from the fact, that a longer duration for reaching the current indicates a bigger inductance, which accordingly may store more energy.

In this way a method for operating an integrated circuit comprising a transistor can be determined, wherein the method at least comprises the steps of determining a current slew-rate for switching the transistor to its non-conducting state, and wherein the determination of the current slew-rate is based on the duration value the transistor has been conducting and on the current flowing through the transistor. The transistor is then controlled to switch to its non-conducting state using the slew-rate.

As the voltage of power supply 110 supplying the load circuit is known in most cases, this voltage may be assumed as constant. For example, in automotive applications, particularly in vehicles, the voltage supply 110 may be a battery or a generator outputting a known voltage. However, in case the voltage of supply 110 is unknown, the voltage of supply 110 may be determined using conventional measuring means.

Considering now that in real life applications the value of an inductance cannot be infinite, the value of the biggest inductance in the load circuit may be assumed to be below a predefined threshold value. For example, in automotive applications a maximum inductance value of $L_{max}$=10 mH can be assumed to be the biggest inductance, which typically may be the coil of an electric motor or of a relay. That is the maximum inductance value comprised in the load circuit of the transistor is not defined via the enable time $t_e$ of the transistor, i.e., the time span the transistor has been conducting, and the current value $I_0$. Instead the maximum inductance value in the load circuit is set as a predefined constant $L_{max}$.

Duration τ for switching the transistor off can thus be determined as:

$$\tau = \left( \frac{\frac{\Delta T_{max,w.c.} \cdot A}{a \cdot U_b I_0} \pm \sqrt{\left(\frac{\Delta T_{max,w.c.} \cdot A}{a \cdot U_b I_0}\right)^2 - 4L_{max} \cdot \frac{I_0}{U_b}}}{2} \right)^2, \quad (11)$$

wherein in the following and for the same reasons as mentioned above for equation (10) only the solution comprising "+" is considered.

Equation (11) accordingly allows determining duration τ taking into account that in real life circuits there is no inductance of infinite value. Consequently when determining τ both equations, i.e., equation (10) and (11), can be considered, wherein the bigger value of τ may be used for controlling the transistor to switch to its non-conducting state.

When comparing equation (10) with equation (11) we find that the only difference is the last term below the root, which allows determining a maximum enable time value $t_{e,max}$ as:

$$t_{e,max} = L_{max} \cdot \frac{I_0}{U_b}, \quad (12)$$

which can be considered to define a maximum value for the value of enable time $t_e$. Accordingly when determining the current slew-rate for switching the transistor to its non-conducting state the duration value the transistor has been conducting, i.e., enable time $t_e$, may be limited to a predefined maximum value.

Figure 4:
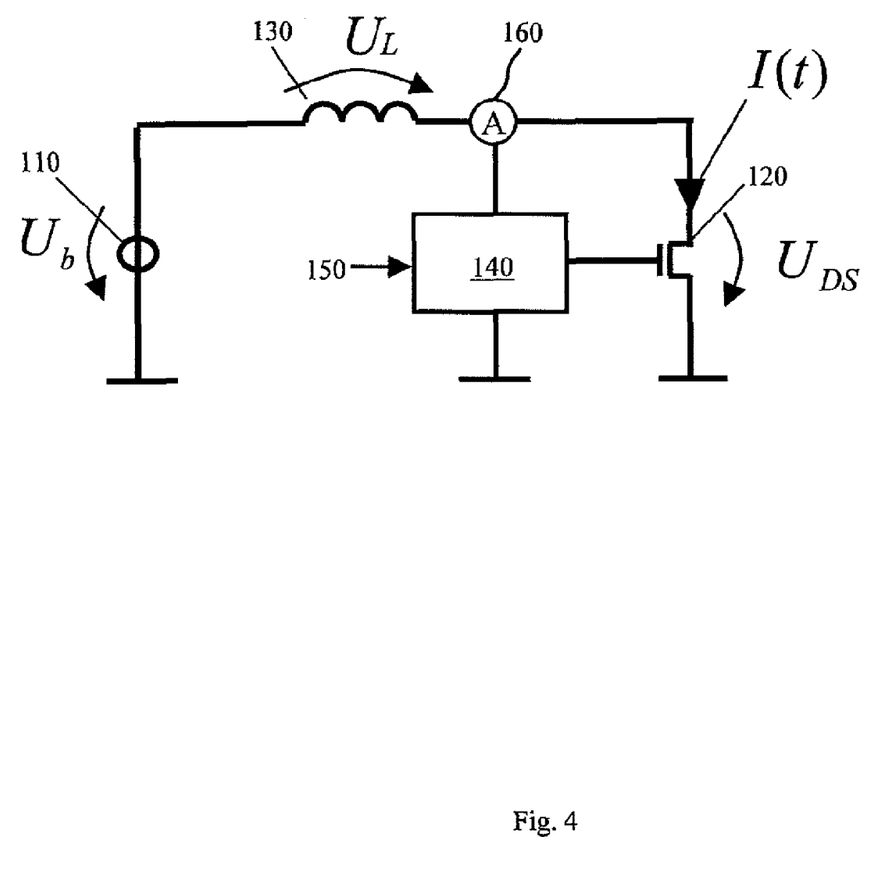
FIG. 4 schematically depicts a first circuit for controllably switching a transistor on and off.

FIG. 4 depicts a circuit for implementing the method for controlling the switch-off process of transistor 110 as described. This circuit comprises power supply 110, transistor 120 and inductance 130 as in FIG. 1. Transistor 120 may be a power MOSFET for coupling inductance 130 to power supply 110. In this way MOSFET 120 acts as a switch for coupling a load circuit, which at least comprises inductance 130, to power supply 110. A control terminal of MOSFET 120, i.e., its gate terminal, is coupled to control block 140 for switching MOSFET 120 to its conducting or non-conducting state according to control signal 150, which in turn is fed into control block 140. Control signal 150 may originate from any arbitrary source and may be of any signaling protocol. In one embodiment the source generating control signal 150 may be a simple switch operated by a user deliberately shutting off the load circuit.

When control signal 150 indicates to switch MOSFET 120 from its conducting state to its non-conducting state, i.e., to switch MOSFET 120 off, and when the signal does not originate from a detected overload situation, then control block 140 determines a current slew-rate for switching the transistor to its non-conducting state based on the duration the transistor has been conducting and the actual current flowing through the transistor. The information about the actual current flowing through transistor 120 is provided by current sensor 160, which senses the actual current I(t) in the load circuit. Current sensor 160 may be of any conventional design providing a suitable signal for further processing in control block 140. In this way control block 140 continuously receives information regarding current I(t). Furthermore control block 140 comprises a timing means for determining enable time span $t_e$, during which transistor 120 has been in its conducting state, i.e., for determining the time span between controlling transistor 120 to switch to its conducting state and reception of control signal 150 indicating to switch transistor 120 to its non-conducting state. Based on this information, i.e., the actual current I(t) and enable time $t_e$, control block 140 determines a current slew-rate for switching transistor 120 from its conducting to its non-conducting state, wherein control block 140 may calculate the current slew-rate according to equation (10). Additionally control block 140 may calculate a current slew-rate according to equation (11), i.e., using the predefined maximum inductance value of $L_{max}$. Also, as described above, the value of enable time $t_e$ may be set to a predefined maximum value $t_{e,max}$, see equation (12). When control block 140 has determined the slew rates taking into account the predefined maximum values it may choose the biggest τ, such that the current slew-rate for shutting transistor 120 off is as small as possible. Note that the current slew-rate dI/dt can be easily determined as dI/dt=$I_0$/τ.

Control block 140 subsequently controls the gate voltage of transistor 120 for switching transistor 120 off. While switching the transistor 120, control block 140 may continuously receive and evaluate the amplitude of current I(t) and may adapt the gate voltage of the transistor 120 accordingly to adjust the current slew-rate, i.e., control block 140 receives current I(t) as feedback signal from current sensor 160.

For evaluating parameters and determining a current slew-rate accordingly, control block 140 is configured and adapted accordingly. In particular, control block 140 may comprise circuitry for receiving the parameters, determining at least one value of a current slew-rate based on the parameters and controlling the gate voltage of transistor 120 accordingly, i.e., such that the current decreases with the determined slew-rate when switching transistor 120 to its non-conducting state. In one embodiment current sensor 160 may provide a digital signal to control block 140, control signal 150 may be a digital signal as well and control block 140 may comprises digital circuitry, for example, a conventional digital signal processor (DSP), for processing the signals. Control block 140 may furthermore comprise a driver stage for controlling the gate voltage of transistor 120 in order to accurately switch transistor 120 off. In an alternative embodiment, control signal 150 may be an analog signal, current sensor 160 may also provide an analog signal indicating current I(t), and control block 140 may comprise analog circuitry for determining a current slew-rate and controlling transistor 120 correspondingly and as described above.

Figure 5:
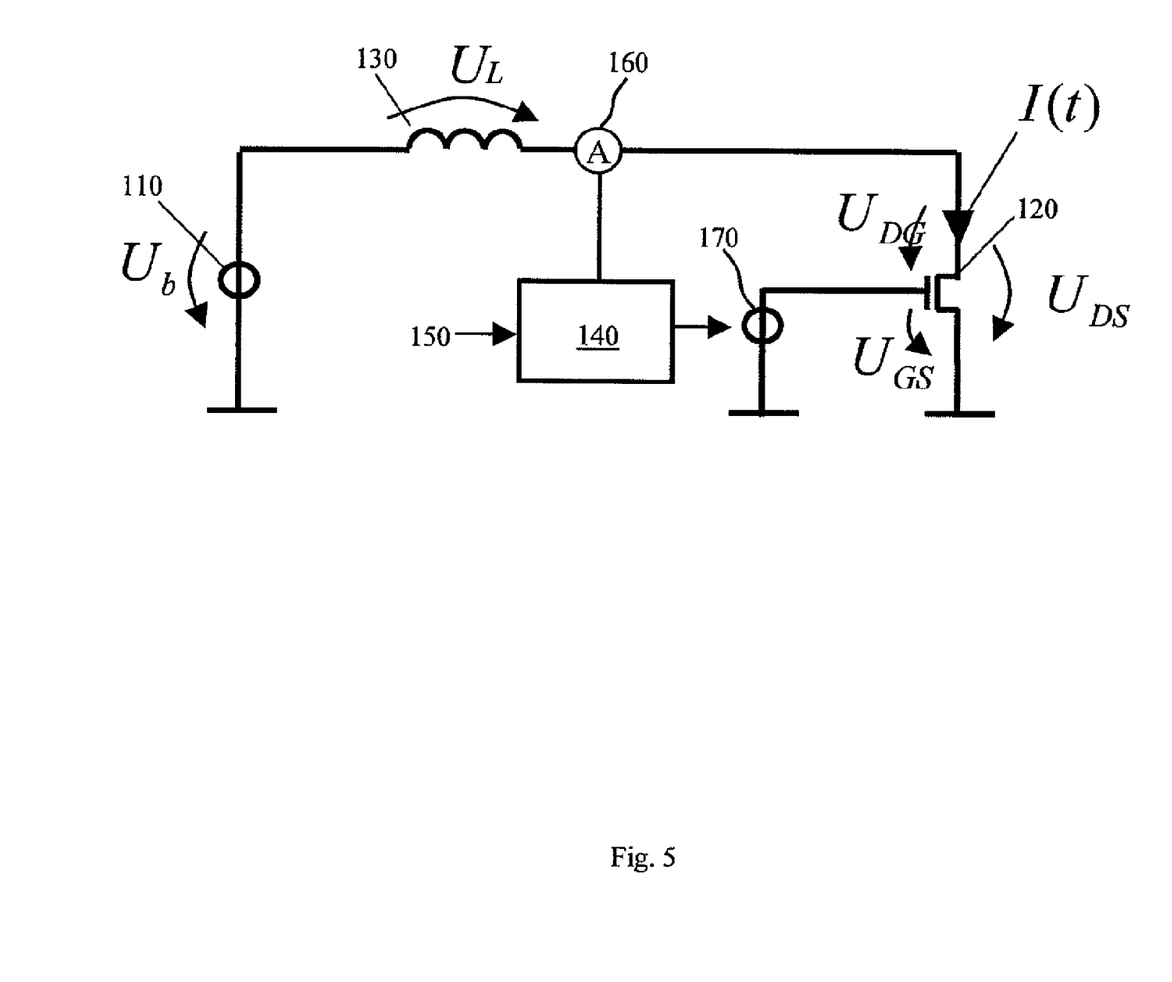
FIG. 5 schematically depicts a second circuit for controllably switching a transistor on or off.

FIG. 5 illustrates an alternative embodiment for controlling the switch-off process according to the above-described method. The circuit comprises power supply 110, an inductance 130 of unknown size and transistor 120 acting as a switch for coupling the load circuit, i.e., inductance 130 to power supply 110. Similar as described for FIG. 4 the circuit further comprises a control block 140 receiving control signal 150 indicating to switch transistor 120 to its conducting or non-conducting state. Also as described for FIG. 4 the circuit comprises current sensor 160 coupled to control block 140 for continuously providing a signal indicating current I(t).

In addition the circuit comprises controllable voltage source 170. Control block 140 is coupled to voltage source 170, which in turn is coupled to the control terminal, i.e., the gate, of transistor 120 for controlling its state.

Considering now the voltages we find:

$$U_b = U_L + U_{DS} \Leftrightarrow U_{DS} = U_b - U_L \qquad (13),$$

wherein $U_{DS}$ is the drain-source voltage across transistor 120. For the process of switching transistor 120 to its non-conducting state we assume constant current slew-rate. According to that voltage $U_L$ across inductance 130 is:

$$U_L = L \cdot \frac{dI}{dt} = L \cdot \frac{I_0}{\tau}. \qquad (14)$$

For determining the unknown value of inductance L we have:

$$L_{w.c.} = U_b \cdot \frac{t_e}{I_0},$$

confer equation (2).

By replacing voltage $U_L$ in (13) with that defined in (14) and considering that dI/dt is negative when switching the transistor off, we find:

$$U_{DS} = U_b - U_L = U_b + L \cdot \frac{I_0}{\tau}, \qquad (15)$$

and wherein we replace the value of the inductance with that as defined in (2), thus, $$U_{DS} = U_b + U_b \cdot \frac{t_e}{I_0} \cdot \frac{I_0}{\tau} = U_b\left(1 + \frac{t_e}{\tau}\right). \qquad (16)$$

That is, the determined constant current slew-rate can be affected by controlling the source-drain voltage $U_{DS}$ according to equation (16). In other words the determined current slew-rate can be achieved by controlling $U_{DS}$.

By replacing τ in (16) with that as defined in (10), the drain source voltage can be determined to:

$$U_{DS} = U_b\left(1 - \frac{t_e}{\tau}\right) = U_b\left[1 - \left(\frac{2}{\frac{\Delta T_{max,w.c.} \cdot A}{a \cdot U_b \cdot I_0 \cdot \sqrt{t_e}} + \sqrt{\left(\frac{\Delta T_{max,w.c.} \cdot A}{a \cdot U_b \cdot I_0 \sqrt{t_e}}\right)^2 - 4}}\right)^2\right]. \qquad (17)$$

Taking into account that, $$U_{DS} = U_{thr} + U_{gateoverdrive} + U_{GS} \Leftrightarrow U_{GS} = U_{DS} - U_{thr} - U_{gateoverdrive} \qquad (18),$$

wherein, $U_{thr}$ is the known threshold voltage of the transistor, $U_{gateoverdrive}$ is the gate overdrive voltage of the transistor, which in turn is a voltage portion above the threshold voltage, typically with $1V \leq U_{gateoverdrive} \leq 2V$. Threshold voltage $U_{thr}$ and gate overdrive voltage $U_{gateoverdrive}$ accordingly can be set constant to known, predefined values, when determining a gate source voltage $U_{GS}$. In this way we can find that gate-drain voltage $U_{GS}$ can be controlled to achieve the determined current slew-rate for switching transistor 120 to its non-conducting state.

Accordingly, when control signal 150 indicates to switch transistor 120 from its conducting state to its non-conducting state, control block 140 determines a gate drain voltage $U_{GS}$ according to equation (18) taking equation (17) into account. That is, at the point in time where control signal 150 indicates to switch the load circuit comprising inductance 130 off, control block 140 takes the actual amplitude of current I(t) and transistor enable time $t_e$ into account to determine a constant gate drain voltage $U_{GS}$ to be applied to transistor 120 for switching the load circuit off. Control block 140 correspondingly controls voltage source 170 to output determined voltage $U_{GS}$, i.e., to control transistor 120 to switch to its non-conducting state, wherein the current slew-rate is as smooth as possible preventing the transistor from being heated above predefined maximum temperature increase $T_{max,w.c.}$. Note that the assumed conditions for switching the transistor off take a worst-case situation into account, which most probably will not apply to real life applications. Consequently the switching process will not heat the pn-junction within the transistor to the predefined maximum value $T_{max,w.c.}$.

Note that in this embodiment, voltage $U_{GS}$ is constant over time, such that there is no feedback consideration once the process of switching transistor 120 to off has started.

Similar as described with reference to FIG. 4, control block 140 may further consider a predefined maximum value for inductance 130, i.e., $L=L_{max}$, which results in a limitation for $t_e$ as defined in equation (12).

Similar as described with reference to FIG. 4, control block 140 may comprise digital or analog circuits for processing the signals and accordingly for determining voltage $U_{GS}$. Controllable voltage source 170 also may be of any conventional design.

In this way transistor 120 may be switched from its conducting to its non-conducting state by determining a constant gate-drain voltage based on the duration the transistor has been conducting and the current through the transistor and applying the determined gate-drain voltage to the transistor. Accordingly the circuit as depicted in FIG. 5 forms an electrical circuit comprising at least transistor 120, which particularly may be a MOSFET, for coupling a load circuit to a power supply, the circuit comprising control means for switching the transistor to its non-conducting state, and wherein the control means is adapted and configured to determine a constant gate-drain voltage for switching the transistor to its non-conducting state based on the duration the transistor has been conducting and the current through the transistor.

What is claimed is:

1. A method for operating an integrated circuit comprising a transistor, the method comprising:
    determining a current slew-rate based on a duration the transistor has been conducting and a current flowing through the transistor; and
    controlling the transistor to switch to its non-conducting state using the slew-rate.

2. The method of claim 1, wherein determining the current slew-rate is further based on a predefined maximum temperature increase of the transistor.

3. The method of claim 1, wherein the transistor acts as a switch for coupling a load circuit to a power supply, and wherein determining the current slew-rate is further based on a voltage of the power supply.

4. The method of claim 3, wherein the transistor is a power MOSFET and the load circuit comprises at least one inductance.

5. The method of claim 4, wherein determining the current slew-rate is based on a predefined maximum inductance value comprised in the load circuit.

6. The method of claim 1, wherein the duration value the transistor has been conducting is limited to a predefined maximum value.

7. An electrical circuit comprising:
    a MOSFET for coupling, a load circuit to a power supply; and
    a control unit coupled to the MOSFET, wherein the control unit is configured to determine a current slew-rate based on a duration the MOSFET has been conducting and an actual current flowing through the MOSFET, the control unit further configured to cause the MOSFET to switch to a non-conducting state based upon the determined slew rate.

8. The circuit of claim 7, wherein the current slew-rate is also determined based on a predefined maximum temperature increase of the MOSFET.

9. The circuit of claim 7, wherein the current slew-rate is also determined based on a voltage of the power supply.

10. The circuit of claim 7, wherein the current slew-rate is also determined based on a predefined maximum inductance value comprised in the load circuit.

11. The circuit of claim 7, wherein the current slew-rate is also determined based on a predefined maximum duration the MOSFET has been conducting.

12. An electrical circuit comprising:
    a MOSFET for coupling a load circuit to a power supply; and
    a control unit coupled to the MOSFET, wherein the control unit is configured to determine a current slew-rate based on a duration the MOSFET has been conducting, and configured to cause the MOSFET to switch to a non-conducting state based upon the determined slew rate.

13. The circuit of claim 12, wherein the control unit is further configured to determine an actual current flowing through the MOSFET and wherein the actual current flowing through the MOSFET is measured by a current sensor.

14. The circuit of claim 13, wherein the current sensor continuously measures an amplitude of the current flowing through the MOSFET.

15. The circuit of claim 13, wherein the current sensor is configured to issue a digital signal to the control unit.

16. The circuit of claim 13, wherein the current sensor is configured to issue an analog signal to the control unit.

17. The circuit of claim 13, wherein the load comprises at least one inductance.

18. The method of claim 1, wherein determining the current slew-rate comprises determining the current slew-rate according to $$\tau = \left( \frac{\frac{\Delta T_{max,w.c.} \cdot A}{a \cdot U_b I_0} \pm \sqrt{\left(\frac{\Delta T_{max,w.c.} \cdot A}{a \cdot U_b I_0}\right)^2 - 4t_e}}{2} \right)^2.$$

19. The method of claim 1, wherein determining the current slew-rate comprises determining the current slew-rate according to $$\tau = \left( \frac{\frac{\Delta T_{max,w.c.} \cdot A}{a \cdot U_b I_0} \pm \sqrt{\left(\frac{\Delta T_{max,w.c.} \cdot A}{a \cdot U_b I_0}\right)^2 - 4L_{max} \cdot \frac{I_0}{U_b}}}{2} \right)^2.$$

20. An electrical circuit comprising:
    means for coupling a load circuit to a power supply; and
    means for controlling the means for coupling, wherein the means for controlling determine a current slew-rate based on a duration the means for coupling have been conducting and an actual current flowing through the means for coupling, the means for controlling cause the means for coupling to switch to a non-conducting state based upon the determined slew rate.

21. The electrical circuit of claim 20, further comprising means for measuring the actual current flowing through the means for coupling.

22. The electrical circuit of claim 20, wherein the load comprises at least one inductance.

23. An integrated circuit configured to be coupled to a transistor, the integrated circuit adapted to determine a current slew-rate based on a duration the transistor has been conducting, and adapted to provide a transistor control signal for switching the transistor to a non-conducting state using the determined current slew-rate.

* * * * *